(12) United States Patent
Wenger

(10) Patent No.: US 6,703,822 B2
(45) Date of Patent: Mar. 9, 2004

(54) CIRCUIT FOR DETECTING A CURRENT PASSING THROUGH A CONSUMER

(75) Inventor: Christoph Wenger, Korntal-Muenchingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/089,466

(22) PCT Filed: Aug. 10, 2001

(86) PCT No.: PCT/DE01/03081

§ 371 (c)(1),
(2), (4) Date: Mar. 28, 2002

(87) PCT Pub. No.: WO02/14879

PCT Pub. Date: Feb. 21, 2002

(65) Prior Publication Data

US 2002/0149356 A1 Oct. 17, 2002

(51) Int. Cl.[7] .............................................. G01R 33/00
(52) U.S. Cl. ................................ 324/117 R; 324/158.1
(58) Field of Search ................... 324/142, 130, 324/117 R, 127, 144, 146, 151 A, 529, 263, 258; 307/261, 270, 228; 363/71, 67; 73/119 A, 119; 327/172, 205

(56) References Cited

U.S. PATENT DOCUMENTS 4,742,296 A * 5/1988 Petr et al. .................. 324/142
4,791,809 A * 12/1988 Schmidt ...................... 73/119

FOREIGN PATENT DOCUMENTS

| DE | 195 49 181 A1 | 7/1997 |
| EP | 0 686 850 A | 12/1995 |
| EP | 0 691 544 A | 1/1996 |
| EP | 0 742 440 A | 11/1996 |
| WO | 95 12819 A | 5/1995 |
| WO | 98 36281 A | 8/1998 |

* cited by examiner

Primary Examiner—Kamand Cuneo
Assistant Examiner—Trung Q. Nguyen
(74) Attorney, Agent, or Firm—Michael J. Striker

(57) ABSTRACT

A circuit arrangement for detecting a current through a consumer 16, which is disposed between the outputs 14c, 15c of two amplifiers 14, 15, which in order to be supplied with a unipolar operating voltage VCC, each have a supply voltage connection 14a, 15a and a ground connection 14b, 15b, is characterized in that between the connection 18a of the operating voltage source and the supply voltage connection 14a, 15a and/or between the ground connection 14b, 15b and ground 18b, an ohmic resistor 17 is provided, at which a voltage $U_A$ falls, which is proportional to the current to be detected.

8 Claims, 3 Drawing Sheets

CIRCUIT FOR DETECTING A CURRENT PASSING THROUGH A CONSUMER

BACKGROUND OF THE INVENTION

The invention relates to a circuit arrangement for detecting a current through a consumer, which is disposed between the outputs of two amplifiers, each of which, in order to be supplied with a unipolar operating voltage, has a supply voltage connection and a ground connection.

In order to measure currents, often circuit arrangements are used, which function according to the compensation principal. In this method, a value is detected, which is proportional to the current to be measured, and by producing the same value with an opposite polarity, the detected value is regulated to zero. The current required to regulate the value to zero represents a measure for the current to be measured. The advantage of this method lies in the fact that the measuring device does not cause interference in the electrical circuit in which the current is to be measured.

For example in order to measure a current drawn from or supplied to a battery in a motor vehicle, it is thus known to detect this current by means of a compensation current sensor. A corresponding circuit arrangement is schematically depicted in FIG. 1.

As can be inferred from FIG. 1, a toroidal core 2 is disposed with an air gap around a supply line 1, for example of a battery. In the air gap of the toroidal core 2, an element 3 is provided for measuring the magnetic field intensity, which is generated by the current through the supply line 1 in the toroidal core 2. The toroidal core 2 is also provided with a coil 6, which can be used to produce a magnetic flux in the toroidal core 2. If a current is sent through the coil 6 and the magnitude of the current is selected so that the magnetic field intensity in the air gap is zero, then the current through the coil 6 corresponds to the current through the supply line 1; the number of windings of the coil 6 must be taken into account here.

In order to measure the current flowing through the coil 6, an ohmic resistor 7 is connected in series with the coil 6. The falling current at the ohmic resistor 7 is a measure for the current flowing through the coil 6 and is consequently a measure for the current flowing through the supply line 1.

In order to be able to measure a current of alternating polarity, it must be possible to change the direction of the current flowing through the coil 6. In order to be able to change the direction of the current flowing through the coil 6, the coil 6 is connected between the outputs of two amplifiers 4, 5. The inputs of the amplifiers 4, 5 are connected to the element 3 for detecting the magnetic field intensities in the air gap of the toroidal core 2 so that the field intensity in the air gap can be regulated to zero.

Although a current of alternating polarity can be in fact measured with the circuit arrangement shown, it still has the disadvantage that the falling voltage at the ohmic resistor 7 has no ground reference. This is disadvantageous particularly because as a rule, the voltage is processed in a microcontroller, whose integrated AD converter is only suited for measuring a voltage between zero volts and $u_{ref}$. This requires a corresponding voltage adaptation, with the attendant costs and imprecisions.

This problem can in fact be eliminated through the use of an amplifier, which can supply a positive and a negative output voltage, but both a positive and a negative supply voltage are required to operate an amplifier of this kind. But since a positive and a negative supply voltage of the required magnitude are not available in a motor vehicle, a circuit arrangement of this kind cannot be used in a motor vehicle.

DE 195 49 181 A1 has disclosed a device for measuring a current flowing in a conductor, in which a magnetic field, which is generated by the current flowing through the conductor, is evaluated in order to determine the current. In the known device, the conductor is embodied so that it has two parts that are disposed parallel to each other and convey the current in different directions. Between the two parts of the conductor, a sensor is provided, which supplies an output signal that is dependent on the magnetic field generated and is representative of the intensity of the flowing current. The known device, however, gives no indication of the use in a compensation current arrangement and the problems associated with this.

SUMMARY OF THE INVENTION

The object of the invention is to embody a circuit arrangement mentioned at the beginning in such a way that it supplies a ground-referenced output signal when operated with a low supply voltage.

According to the invention, a circuit arrangement for detecting a current through a consumer, which is disposed between the outputs of two amplifiers that each have a supply voltage connection and a ground connection in order to be supplied with a unipolar operating voltage, characterized in that between the connection of the operating voltage source and the supply voltage connection and/or between the ground connection and ground, an ohmic resistor is provided, at which a voltage falls, which is proportional to the current to be measured.

Since an ohmic resistor, at which a voltage falls, which is proportional to the current to be measured, is connected between the connection of the operating voltage source and the supply voltage connection and/or between the ground connection and ground, then a ground potential-referenced voltage can easily be produced, which is proportional to the compensation current.

The invention takes advantage of the fact that the output voltage supplied by the amplifiers essentially corresponds to the current drawn from the operating voltage source to supply the amplifiers. In this connection, it is naturally important that the quadrature-axis current of the amplifiers is very low. In amplifiers of this kind, the current drawn from the operating current source flows almost entirely through the consumer so that the current flowing through the consumer does not have to be measured directly in the current path in which the consumer is disposed, but can be measured in the supply voltage supply line or supply voltage discharge line of the amplifiers.

In a particularly advantageous embodiment of the invention, the ground connections of the amplifiers are connected to each other and the ohmic resistor is disposed between the connected ground connections and ground. Since only one ohmic resistor is used in a circuit arrangement of this kind, the current can be detected very precisely, no matter which direction the current is flowing through the consumer. This is particularly due to the elimination of imprecision with regard to the component tolerances that can occur when several ohmic resistors are used to detect the current. In a particularly advantageous manner, the use of a single ohmic resistor produces a characteristic curve without a bend at the zero point.

In order to determine the current direction through the consumer, in the embodiment described above, the voltage drop at the consumer can be measured by means of an amplifier, where the output voltage of the consumer is used to determine the current direction, as is provided in another particular embodiment of the invention. It is particularly advantageous if the amplifier is embodied as a comparator. As a result, a voltage polarity, which corresponds to the flow direction through the consumer, can be picked up at the output of the amplifier or comparator.

If it is desirable to eliminate the amplifier for determining the current direction through the consumer, then a separate ohmic resistor can be provided between the ground connection of each amplifier and ground, as is provided in another particular embodiment of the invention. The magnitude of the falling voltage at an ohmic resistor corresponds to the magnitude of the current through the consumer. The direction of the current flowing through the consumer is a function of which ohmic resistor a voltage drop occurs at so that the direction of the current through the consumer is determined by means of this. It should be noted, however, that in an embodiment of this kind, there should be virtually no difference between the electrical behavior of the ohmic resistors.

A very advantageous embodiment of the invention has turned out to be one in which the power output stages of the amplifiers are comprised of MOSFETs, which function in push-pull B operation. In this connection, it is very advantageous if the power output stages of the amplifiers are each triggered by means of an operational amplifier that the output of the relevant power output stage is coupled back to. In an embodiment of this kind, it is very useful that the supply voltage of the operational amplifier is higher than the operating voltage of the circuit arrangement, as a result of which the power output stage transistors can be controlled in a fully advanced manner. Advantageously, the supply voltage of the operational amplifier can be generated by means of a charging pump, as is provided in another particular embodiment of the invention.

The use of MOSFET power output stages advantageously results in the fact that no quadrature-axis currents flow. Since the gates of the transistors are insulated, the current flows through the charge and inevitably also through the relevant ohmic resistor. The higher supply voltage of the operational amplifiers advantageously results in the fact that the power output stage transistors can be controlled in a fully advanced manner. The use of a charging pump permits the higher supply voltage of the operational amplifiers to be generated in a simple manner.

In an integrated circuit (ASIC), there are corresponding possibilities for embodying the power output stages without a charging pump. In this connection, bipolar types are used as the power transistors. Alternatively, it is conceivable to use a conventional integrated earphone since the coils of an earphone have similar values to those of a coil for compensation of the electrical field of the toroidal core.

For polarity detection, the voltage between the two branches of the bridge exciter can be evaluated. To this end, in the ASIC, the voltage at the two bases of the NPN- or PNP-pair are compared by means of a comparator.

The essential advantage of the invention is that with an appropriate dimensioning, only the tolerance of the ohmic resistor affects the measurement precision. Through the ground reference of the output voltage, this voltage can be sent directly to an analog/digital converter that is usually disposed in a controller used for evaluation, which has a very advantageous effect on the costs. In addition, a precision amplifier is not required, which can also reduce costs.

Other details, features, and advantages of the current invention ensue from the following description of a particular exemplary embodiment with reference to the drawings.

DESCRIPTION OF THE PREFERRED EMBODIMENTS

Figure 1:
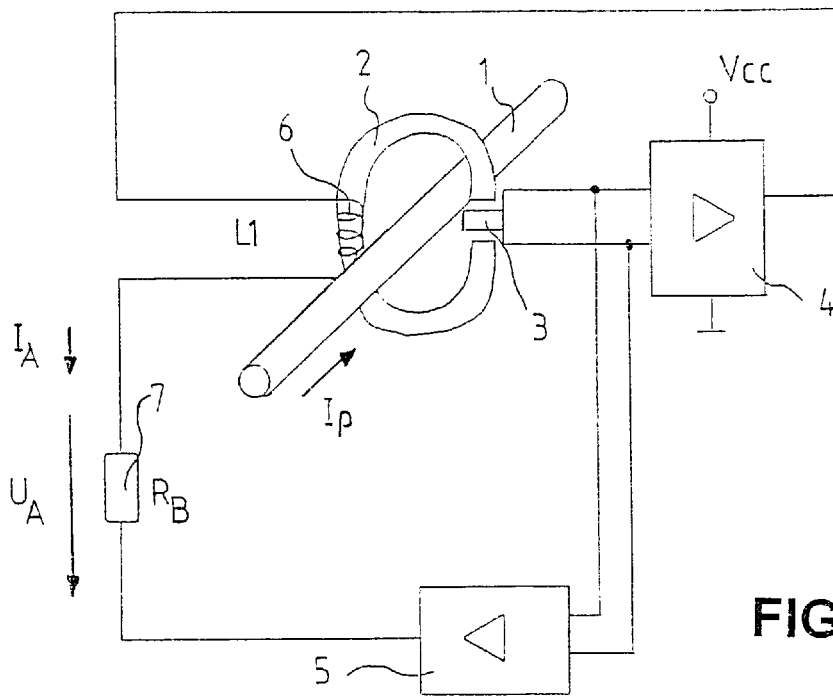
FIG. 1 shows a conventional circuit arrangement of a compensation current sensor.
Figure 2:
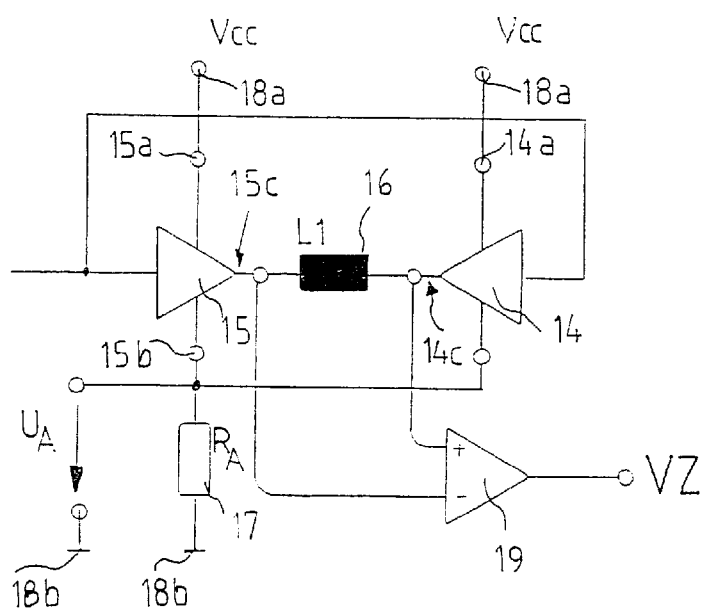
FIG. 2 is a schematic representation of a first embodiment of a circuit arrangement according to the invention.

As can be inferred from FIG. 2, a consumer 16, which is embodied as a compensation coil, is connected between the outputs 14c, 15c from two amplifiers 14, 15. In order to be supplied with a unipolar operating voltage $V_{CC}$, the amplifiers 14, 15 have a supply voltage connection 14a, 15a and a ground connection 14b, 15b. The supply connections 14a, 15a are connected directly to the connection 18a of the operating voltage source $V_{CC}$. The ground connections 14b, 15b are connected to each other directly. An ohmic resistor 17 is connected between the connected ground connections 14b, 15b and the mass 18b. The falling voltage $U_A$ at the ohmic resistor 17 is a measure for the current flowing through the consumer 16.

The falling voltage at the consumer 16 is sent to the input of a comparator 19. The output voltage of the comparator 19 can be used to evaluate the direction of the current flow through the consumer 16.

The amplifications of the amplifiers 14, 15 are set so that the first amplifier 14 has an amplification of minus 1 and the second amplifier 15 has an amplification of 1.

Figure 3:
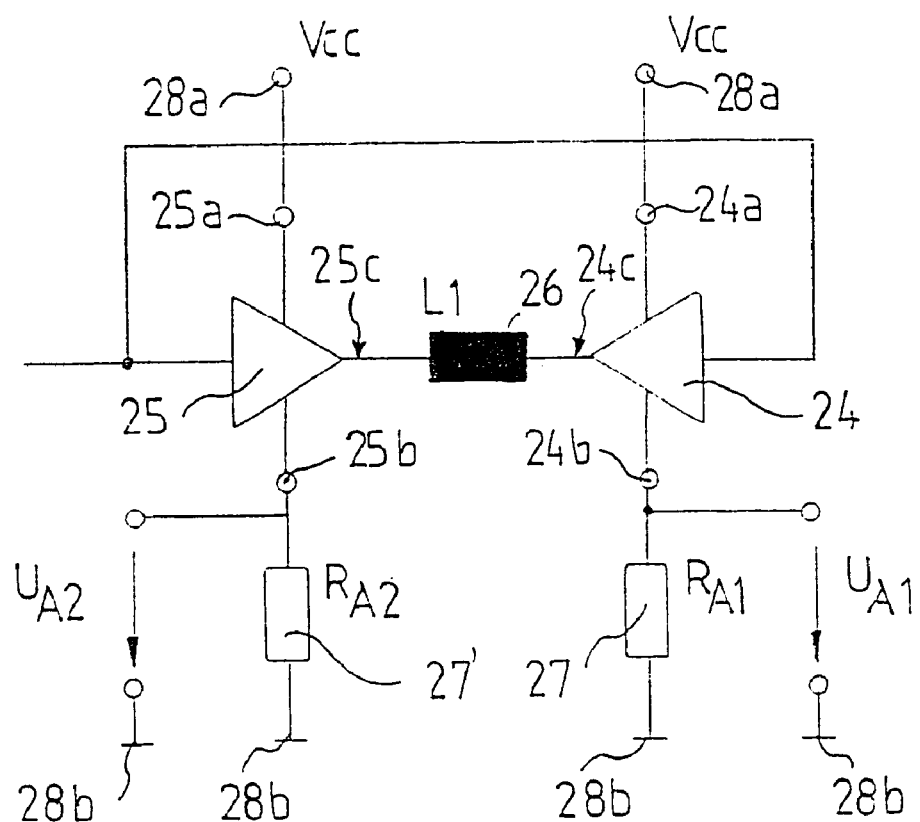
FIG. 3 is a schematic representation of a second embodiment of a circuit arrangement according to the invention.

The circuit arrangement shown in FIG. 3 corresponds essentially to the circuit arrangement shown in FIG. 2. In order to distinguish between the components, however, the reference numerals begin with 2 instead of 1.

In contrast to the circuit arrangement according to FIG. 2, in the circuit arrangement according to FIG. 3, the ground connections 24b, 25b of the amplifiers 24, 25 are not connected to each other directly. The ground connections 24b, 25b are each connected to ground 28b by means of a separate ohmic resistor 27, 27'.

The voltage drop $U_{A1}$ at the first ohmic resistor 27 corresponds to the magnitude of the current through the consumer 26 at a current flow from the output 25c of the second amplifier 25 to the output 24c of the first amplifier 24. The voltage drop at the second ohmic resistor 27' corresponds to the magnitude of the current through the amplifier 26 from the output 24c of the first amplifier 24 to the output 25c of the second amplifier 25. The voltage drop at the ohmic resistors 27, 27' is thus simultaneously used for detecting the current direction through the consumer 26.

Figure 4:
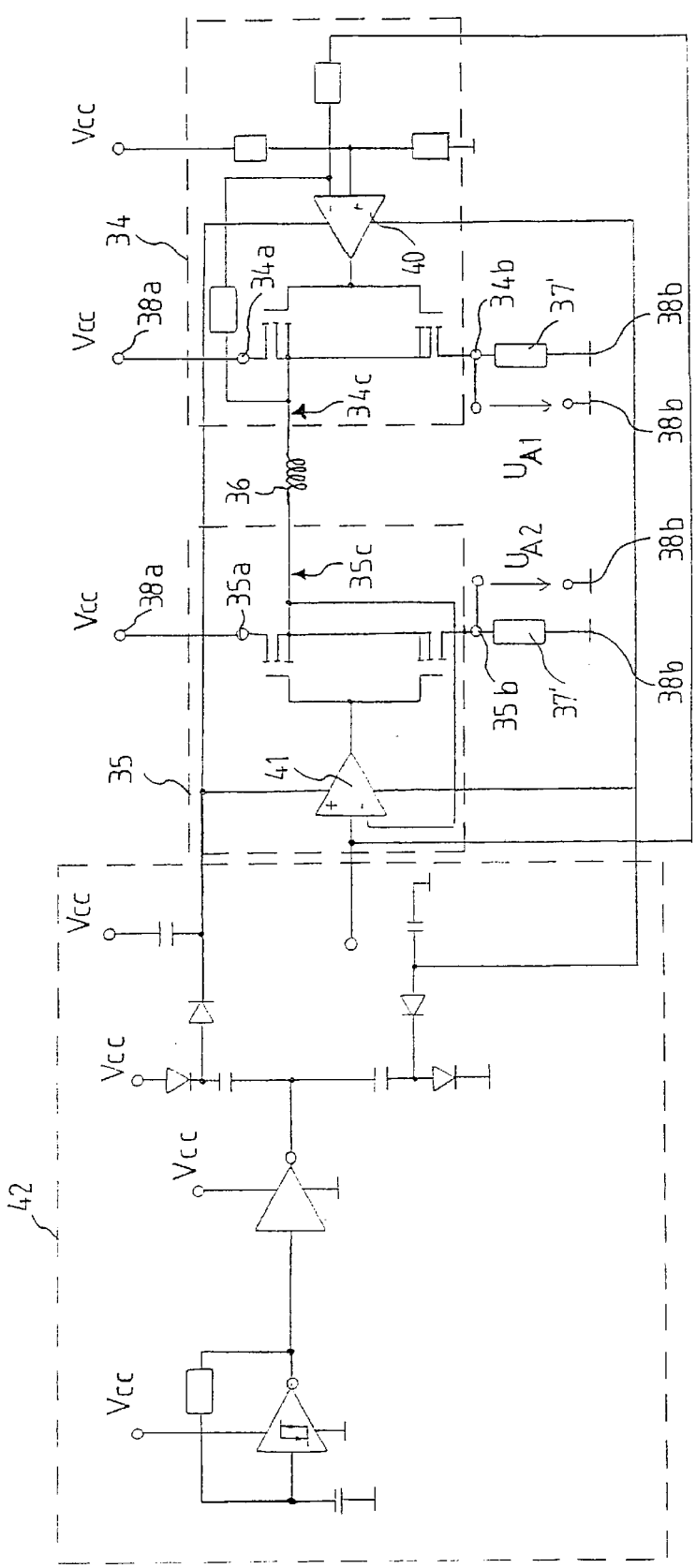
FIG. 4 is a schematic representation of a third embodiment of a circuit arrangement according to the invention.

The circuit arrangement shown in FIG. 4 corresponds essentially to the circuit arrangement from FIG. 3. In order to distinguish between the components, however, the reference numerals begin with 3 instead of 2.

In the circuit arrangement shown in FIG. 4, the amplifiers 34, 35 are comprised of a power output stage made up of MOSFETs, which operate in push-pull B operation and are triggered by operational amplifiers 40, 41. In each power output stage, an ohmic resistor 37, 37' is connected between the ground connection 34b, 35b and ground 38b. The ground connection 34b, 35b corresponds to the drain of the P-channel transistor. The advantage of the circuit arrangement lies in the fact that the system does not permit any quadrature-axis current to flow. Since the gates of the transistors are insulated, the current flowing through the consumer 36 inevitably also flows through the corresponding ohmic resistor 37, 37'.

So that the power output stages can be filly advance controlled by the operational amplifiers 40, 41, the operational amplifiers 40, 41 have their higher supply voltage, which they draw from a charging pump 42. The charging pump 42 operates in a conventional manner, so the operation of this charging pump 42 will not be described here.

The operational amplifiers 40, 41 are connected so that the first amplifier 34 has an amplification of minus 1 and the second amplifier 35 has an amplification of 1.

What is claimed is:

1. A circuit arrangement for detecting a current through a consumer (16; 26;36), which is disposed between the outputs (14c, 15c; 24c, 25c; 34c, 35c) of two amplifier (14, 15; 24, 25; 34, 35), which in order to be supplied with a unipolar operating voltage (Vcc), each have a supply voltage connection (14a, 15a; 24a, 25a; 34a, 35a) and a ground connection (14b, 15b; 24b, 25b; 34b, 35b), characterized in that between the connection (18a; 28a; 38a) of the operating voltage source and the supply voltage connection (14a, 15a; 24a, 25a; 34a, 35a) and/or between the ground connection (14b, 15b; 24b, 25b; 34b, 35b) and ground (18b; 28b; 38b), an ohmic resistor (17; 27, 27'; 37, 37') is provided, at which a voltage falls, which is proportional to the current to be detected, and the power output stages of the amplifiers (34, 35) are comprised of MOSFETs, which operate in push-pull B operation.

2. The circuit arrangement according to claim 1, characterized in that the ground connections (14b, 15b) are connected to each other and the ohmic resistor (17) is disposed between the connected ground connections (14b, 15b) and ground (18b).

3. The circuit arrangement according to claim 2, characterized in that the falling voltage at the consumer (16) is sent to an amplifier (19) and the output voltage of the amplifier (19) is used to determine the current direction.

4. The circuit arrangement according to claim 3, characterized in that the amplifier (19) is a comparator.

5. The circuit arrangement according to claim 1, characterized in that a separate ohmic resistor (27, 27'; 37, 37') is disposed between each ground connection (24b, 25b; 34b, 35b) and ground (28b).

6. The circuit arrangement according to claim 1, characterized in that the power output stages of the amplifiers (34, 35) are each triggered by means of an operational amplifier (40, 41), which the output of the relevant power output stage is coupled back to.

7. The circuit arrangement according to claim 6, characterized in that the supply voltage ($U_H$) of the operational amplifiers (40, 41) is higher than the operating voltage ($V_{CC}$).

8. The circuit arrangement according to claim 7, characterized in that the supply voltage ($U_H$) of the operational amplifiers is generated by means of charging pump (42).

* * * * *